US009159847B2

(12) United States Patent
Lee et al.

(10) Patent No.: US 9,159,847 B2
(45) Date of Patent: Oct. 13, 2015

(54) SCHOTTKY BARRIER DIODE AND METHOD OF MANUFACTURING THE SAME

(71) Applicant: Hyundai Motor Company, Seoul (KR)

(72) Inventors: Jong Seok Lee, Suwon-si (KR); Kyoung-Kook Hong, Hwaseong-si (KR); Dae Hwan Chun, Gwangmyung-si (KR); Youngkyun Jung, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 31 days.

(21) Appl. No.: 14/098,359

(22) Filed: Dec. 5, 2013

(65) Prior Publication Data

US 2014/0183558 A1 Jul. 3, 2014

(30) Foreign Application Priority Data

Dec. 27, 2012 (KR) ........................ 10-2012-0155379

(51) Int. Cl.

| | |
|---|---|
| ***H01L 31/0312*** | (2006.01) |
| ***H01L 29/872*** | (2006.01) |
| ***H01L 29/16*** | (2006.01) |
| ***H01L 29/66*** | (2006.01) |
| ***H01L 29/06*** | (2006.01) |
| ***H01L 29/08*** | (2006.01) |

(52) U.S. Cl.

CPC .......... *H01L 29/872* (2013.01); *H01L 29/0615* (2013.01); *H01L 29/0619* (2013.01); *H01L 29/0804* (2013.01); *H01L 29/1608* (2013.01); *H01L 29/6606* (2013.01)

(58) Field of Classification Search

CPC .. H01L 29/1608; H01L 29/47; H01L 29/6606
USPC ..................... 257/77, 473, 475; 438/570, 572
See application file for complete search history.

(56) References Cited

U.S. PATENT DOCUMENTS

| | | | | |
|---|---|---|---|---|
| 6,406,033 B1* | 6/2002 | Jessberger | .................... | 277/616 |
| 2014/0264563 A1* | 9/2014 | Cheng et al. | .................. | 257/330 |

* cited by examiner

*Primary Examiner* — Theresa T Doan
(74) *Attorney, Agent, or Firm* — McDermott Will & Emery LLP

(57) ABSTRACT

A schottky barrier diode includes: an n− type epitaxial layer that is disposed at a first surface of an n+ type silicon carbide substrate; a plurality of n type pillar areas that are disposed at the inside of the n− type epitaxial layer and that are disposed at a first portion of the first surface of the n+ type silicon carbide substrate; a p type area that is disposed at the inside of the n− type epitaxial layer and that is extended in a direction perpendicular to the n type pillar areas; a plurality of p+ areas in which the n− type epitaxial layer is disposed at a surface thereof and that are separated from the n type pillar areas and the p type area; a schottky electrode that is disposed on the n− type epitaxial layer and the p+ areas; and an ohmic electrode that is disposed at a second surface of the n+ type silicon carbide substrate.

5 Claims, 12 Drawing Sheets

300 600 200 500 400 100 700
B A B A B A B A B

SCHOTTKY BARRIER DIODE AND METHOD OF MANUFACTURING THE SAME

CROSS-REFERENCE TO RELATED APPLICATION

This application claims priority to and the benefit of Korean Patent Application No. 10-2012-0155379 filed in the Korean Intellectual Property Office on Dec. 27, 2012, the entire contents of which are incorporated herein by reference.

BACKGROUND

1. Technical Field

The present disclosure relates to a schottky barrier diode including silicon carbide (SiC) and a method of manufacturing the same.

2. Background

A schottky barrier diode (SBD) does not use a PN junction, unlike a general PN diode, which uses a schottky junction in which a metal and a semiconductor are bonded, represents fast switching characteristics, and has turn-on voltage characteristics lower than that of a PN diode.

In a conventional SBD, in order to improve reduction characteristics of a leakage current, by applying a structure of a junction barrier schottky (JBS) in which a p+ area is formed to a lower end portion of a schottky junction portion, and by overlapping of a PN diode depletion layer that is diffused when an inverse voltage is applied, a leakage current is intercepted and a breakdown voltage is improved.

However, as a p+ area exists in the schottky junction portion, a contact area with an n-epitaxial layer or an n-drift layer and a schottky electrode to be a current path of a forward direction decreases and thus there is a problem that a resistance value increases and on-resistance of the SBD increases.

The above information disclosed in this Background section is only for enhancement of understanding of the background of the disclosure.

SUMMARY

The present disclosure has been made in an effort to provide an SBD and a method of manufacturing the same having advantages of lowering on-resistance of the SBD when a forward direction voltage is applied.

The present disclosure has been made in an effort to further provide an SBD and a method of manufacturing the same having advantages of preventing a breakdown voltage of an SBD from reducing when a backward direction voltage is applied.

An exemplary embodiment of the present disclosure provides a schottky barrier diode including: an n− type epitaxial layer that is disposed at a first surface of an n+ type silicon carbide substrate; a plurality of n type pillar areas that are disposed at an inside of the n− type epitaxial layer and that are disposed at a first portion of the first surface of the n+ type silicon carbide substrate; a p type p type area that is disposed at the inside of the n− type epitaxial layer and that is extended in a direction perpendicular to the n type pillar areas; a plurality of p+ areas in which the n− type epitaxial layer is disposed at a surface thereof and that are separated from the n type pillar areas and the p type area; a schottky electrode that is disposed on the n− type epitaxial layer and the p+ areas; and an ohmic electrode that is disposed at a second surface of the n+ type silicon carbide substrate, wherein the p type area is disposed between an upper surface of the n type pillar areas and the first surface of the n+ type silicon carbide substrate.

A doping concentration of the n type pillar areas may be larger than that of the n− type epitaxial layer.

The p type area may be disposed at a portion corresponding to a second portion of the first surface of the n+ type silicon carbide substrate adjacent to the first portion of the first surface of the n+ type silicon carbide substrate.

The p+ areas may be disposed at a portion corresponding to the second portion of the first surface of the n+ type silicon carbide substrate.

The p type area and the p+ areas may be disposed at a corresponding portion between the n type pillar areas.

Another embodiment of the present disclosure provides a method of manufacturing a schottky barrier diode, the method including: forming a first buffer layer pattern that exposes a first portion of a first surface of an n+ type silicon carbide substrate at the first surface of the n+ type silicon carbide substrate; forming a plurality of n type pillar areas with a first epitaxial growth at the first portion of the first surface of the n+ type silicon carbide substrate; exposing a second portion of the first surface of the n+ type silicon carbide substrate adjacent to the first portion of the first surface of the n+ type silicon carbide substrate by removing the first buffer layer pattern; forming a second buffer layer pattern on the n type pillar areas; forming a first preliminary n− type epitaxial layer with a second epitaxial growth in the second portion of the first surface of the n+ type silicon carbide substrate and forming a p type area with a third epitaxial growth on the first preliminary n− type epitaxial layer; removing some of the p type area and forming a second preliminary n− type epitaxial layer with a fourth epitaxial growth on the first preliminary n− type epitaxial layer and the p type areas; removing the second buffer layer pattern and completing an n− type epitaxial layer with a fifth epitaxial growth on the second preliminary n− type epitaxial layer and the n type pillar areas; forming a plurality of p+ areas by injecting p+ ions to a surface of the n− type epitaxial layer; forming a schottky electrode on the p+ areas and the n− type epitaxial layer; and forming an ohmic electrode at a second surface of the n+ type silicon carbide substrate, wherein the p type area is formed between an upper surface of the n type pillar areas and the first surface of the n+ type silicon carbide substrate.

The n type pillar areas and the first buffer layer pattern may have the same thickness.

The n type pillar areas and the second preliminary n− type epitaxial layer may have the same thickness.

In this way, according to an exemplary embodiment of the present disclosure, in an SBD, by disposing n type pillar areas having a doping concentration larger than that of an n− type epitaxial layer at the inside of the n− type epitaxial layer, when a forward direction voltage of the SBD is applied, on-resistance of the SBD can be largely educed.

Further, by disposing a p type area between an upper surface of the n type pillar areas within the n− type epitaxial layer and an n+ type silicon carbide substrate, when a forward direction voltage of the SBD is applied, a breakdown voltage of the SBD can be prevented from reducing.

DETAILED DESCRIPTION OF THE EMBODIMENTS

Figure 1:
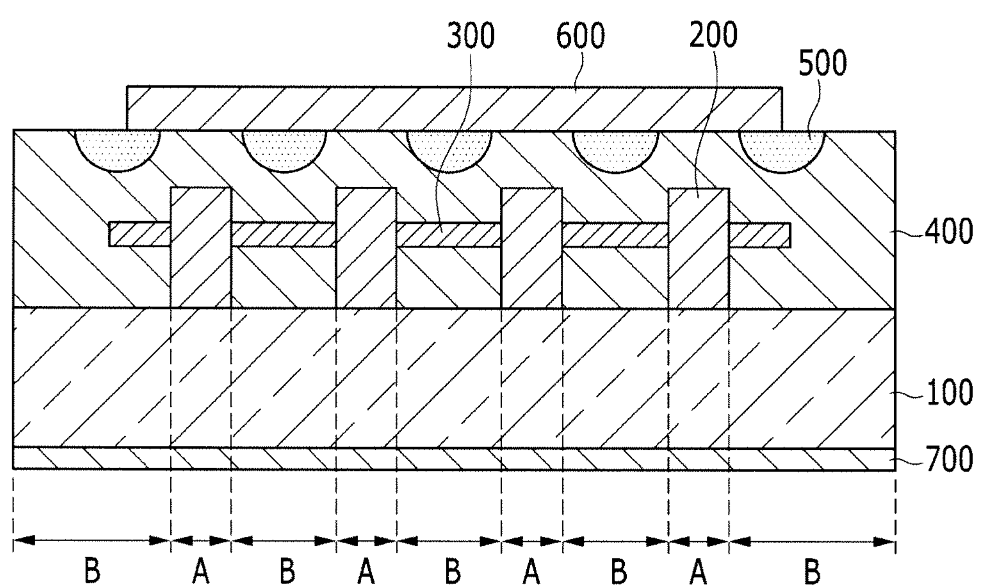
FIG. 1 is a cross-sectional view illustrating an SBD according to an exemplary embodiment of the present disclosure.

Exemplary embodiments of the present disclosure will be described in detail with reference to the accompanying drawings. The described embodiments may be modified in various different ways, all without departing from the spirit or scope of the present disclosure. Exemplary embodiments introduced here are provided to completely provide disclosed contents and to fully transfer the spirit and scope of the present disclosure to a person of an ordinary skill in the art.

In the drawings, the thickness of layers and regions are exaggerated for clarity. When it is described that a layer is positioned on another layer or substrate, it means the layer may be directly formed on the another layer or substrate or a third layer may be interposed therebetween. Like reference numerals designate like elements throughout the specification.

FIG. 1 is a cross-sectional view illustrating an SBD according to an exemplary embodiment of the present disclosure.

Referring to FIG. 1, in the SBD according to the present exemplary embodiment, at a first surface of an n+ type silicon carbide substrate 100, an n− type epitaxial layer 400 may be disposed, and at a surface of the n− type epitaxial layer 400 opposite the n+ type silicon carbide substrate 100, a plurality of p+ areas 500 may be disposed. On the n− type epitaxial layer 400 and the p+ areas 500, a schottky electrode 600 may be disposed, and at a second surface of the n+ type silicon carbide substrate 100 opposite the first surface, an ohmic electrode 700 may be disposed. The schottky electrode 600 may contact the n− type epitaxial layer 400 and the p+ areas 500.

Further, at the first surface of the n+ type silicon carbide substrate 100 within the n− type epitaxial layer 400, a plurality of n type pillar areas 200 having a doping concentration larger than that of the n− type epitaxial layer 400 may be disposed. The first surface of the n+ type silicon carbide substrate 100 includes a plurality of adjacent first portions A and second portions B, and the n type pillar areas 200 may be disposed on the first portion A of the first surface of the n+ type silicon carbide substrate 100.

Further, a p type area 300 may be disposed within the n− type epitaxial layer 400. The p type area 300 may be extended in a direction perpendicular to the n type pillar areas 200 and separately disposed from the first surface of the n+ type silicon carbide substrate 100. The p type area 300 may be disposed at a portion corresponding to the second portion B of the first surface of the n+ type silicon carbide substrate 100 and disposed between an upper surface of the n type pillar areas 200 and the first surface of the n+ type silicon carbide substrate 100.

The p+ areas 500 may be separately disposed from the n type pillar areas 200 and the p type area 300 and disposed at a portion corresponding to the second portion B of the first surface of the n+ type silicon carbide substrate 100. That is, the p+ areas 500 may be disposed at a corresponding portion between the n type pillar areas 200.

Because a doping concentration of the n type pillar areas 200 may be larger than that of the n− type epitaxial layer 400, when a forward direction voltage of the SBD is applied, most of electrons and a current flow through the n type pillar areas 200. Accordingly, when a forward direction voltage of the SBD is applied, if electrons and a current flow through the n type pillar areas 200 and the n− type epitaxial layer 400, the electrons and the current receive small resistance and thus on-resistance of the SBD is reduced.

Further, when a backward direction voltage of the SBD is applied, a high electric field distribution occurs even in a bonding portion of the n− type epitaxial layer 400 and a lower portion of the p type area 300 as well as a bonding portion of the n− type epitaxial layer 400 and a lower portion of the p+ areas 500 and thus an electric field is distributed into two bonding portions, whereby a breakdown voltage can be prevented from being reduced.

Hereinafter, a method of manufacturing a semiconductor element according to an exemplary embodiment of the present disclosure will be described in detail with reference to FIGS. 1 and 2 to 8.

FIGS. 2 to 8 are cross-sectional views sequentially illustrating a method of manufacturing an SBD according to an exemplary embodiment of the present disclosure.

Figure 2:
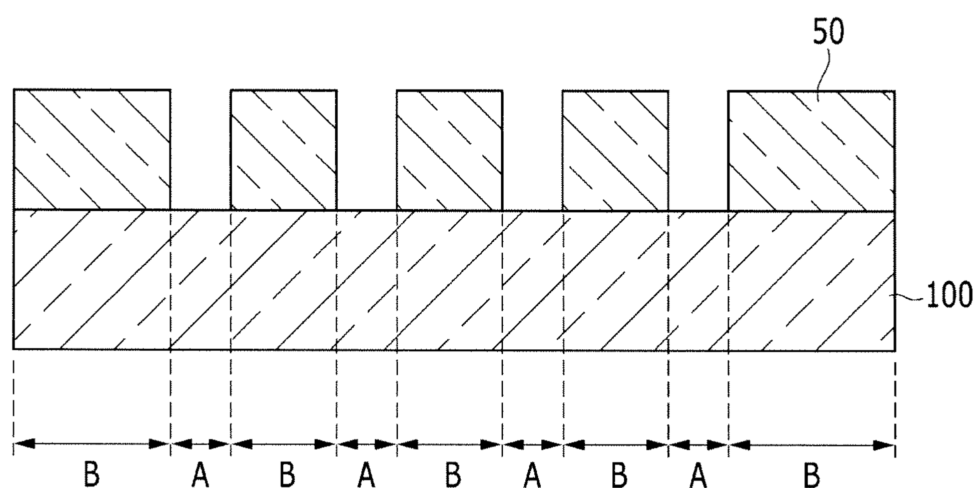
FIGS. 2 to 8 are cross-sectional views sequentially illustrating a method of manufacturing an SBD according to an exemplary embodiment of the present disclosure.

As shown in FIG. 2, the n+ type silicon carbide substrate 100 may be prepared, and at the first surface of the n+ type silicon carbide substrate 100, a first buffer layer pattern 50 may be formed. The first buffer layer pattern 50 exposes the first portion A of the first surface of the n+ type silicon carbide substrate 100.

Figure 3:
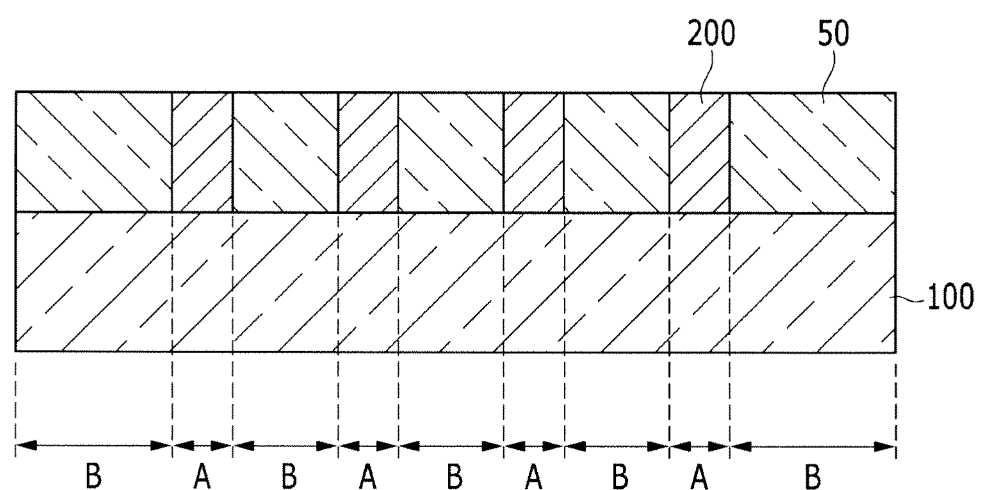

As shown in FIG. 3, a plurality of n type pillar areas 200 may be formed with a first epitaxial growth in the first portion A of the first surface of the n+ type silicon carbide substrate 100. The n type pillar areas 200 and the first buffer layer pattern 50 may have the same thickness.

Figure 4:
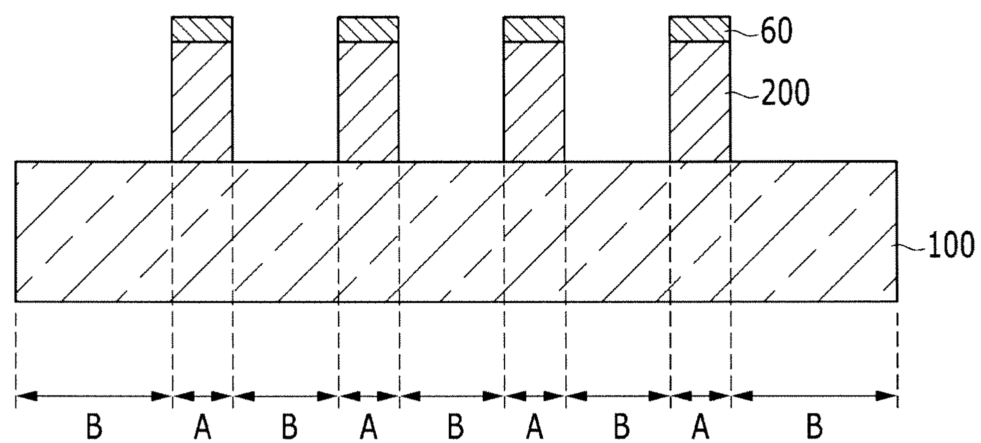

As shown in FIG. 4, by removing the first buffer pattern 50, the second portion B of the first surface of the n+ type silicon carbide substrate 100 is exposed and a second buffer layer pattern 60 formed on the n type pillar areas 200. The second portion B of the first surface of the n+ type silicon carbide substrate 100 may be disposed adjacent to the first portion A of the first surface of the n+ type silicon carbide substrate 100.

Figure 5:
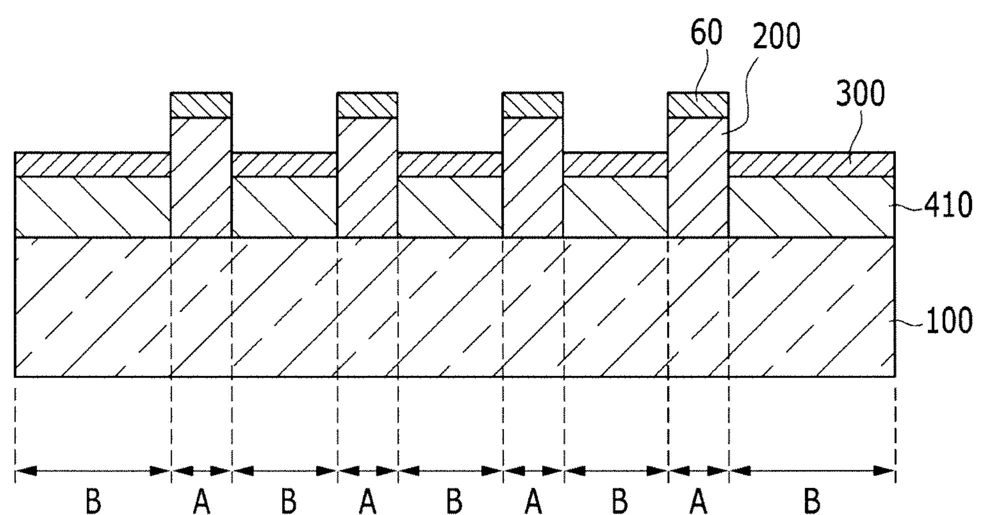

As shown in FIG. 5, in the second portion B of the first surface of the n+ type silicon carbide substrate 100, a first preliminary n− type epitaxial layer 410 may be formed with a second epitaxial growth, and the p type area 300 formed with a third epitaxial growth on a first preliminary n− type epitaxial layer 410. In this case, the n type pillar areas 200 does not perform the second epitaxial growth and the third epitaxial growth by the second buffer layer pattern 60. An upper surface of the p type area 300 is positioned under an upper surface of the n type pillar areas 200.

Figure 6:
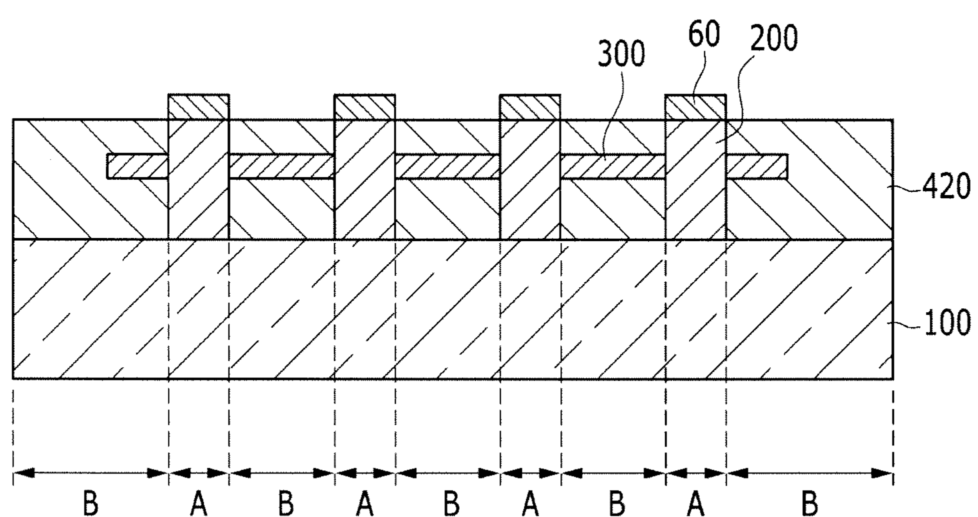

As shown in FIG. 6, after some of the p type area 300 is removed, a second preliminary n− type epitaxial layer 420 may be formed with a fourth epitaxial growth on the first preliminary n− type epitaxial layer 410 and the p type area 300. A second preliminary n− type epitaxial layer 420 may have the same thickness as that of the n type pillar areas 200. In this case, the n type pillar areas 200 do not perform a fourth epitaxial growth by the second buffer layer pattern 60.

Figure 7:
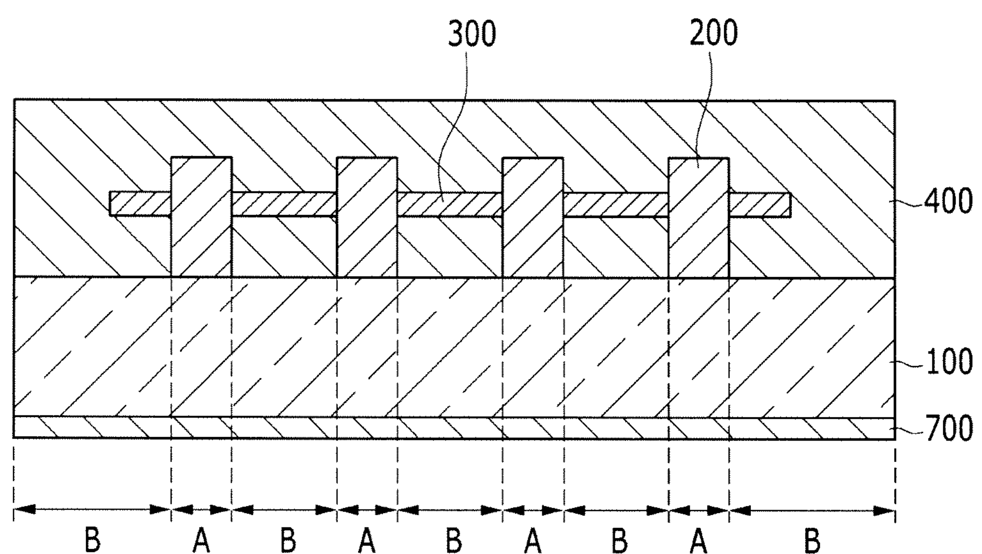

As shown in FIG. 7, after the second buffer layer pattern 60 is removed, the n− type epitaxial layer 400 may be completed with a fifth epitaxial growth on the second preliminary n− type epitaxial layer 420 and the n type pillar areas 200. Due to such a process, the n type pillar areas 200 and the p type area 300 may be positioned within the n− type epitaxial layer 400. Particularly, the p type area 300 may be positioned between an upper surface of the n type pillar areas 200 and the first surface of the n+ type silicon carbide substrate 100. A doping concentration of the n− type epitaxial layer 400 may be smaller than that of the n type pillar areas 200.

Figure 8:
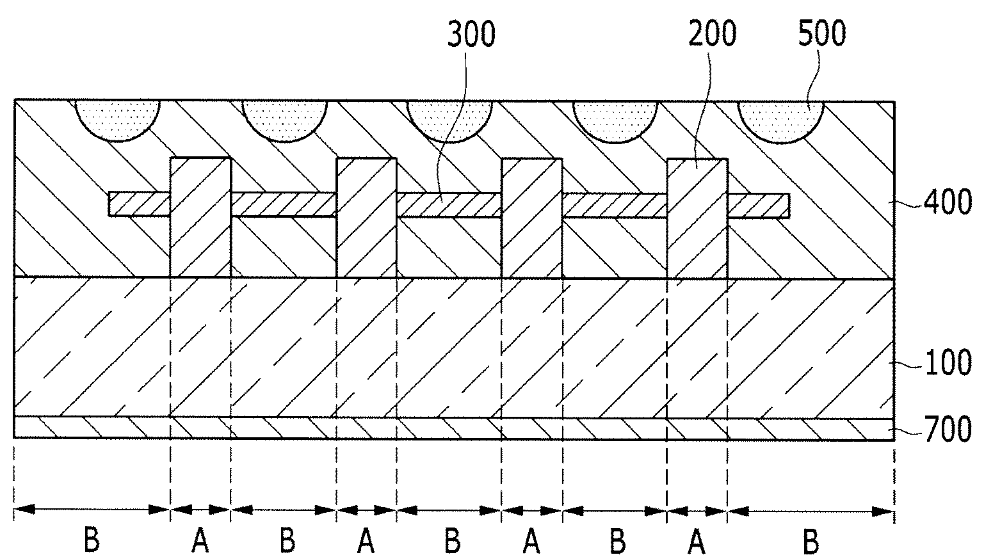

As shown in FIG. 8, by injecting p+ ions to a surface of the n− type epitaxial layer 400 corresponding to the second portion B of the first surface of the n+ type silicon carbide substrate 100, a plurality of p+ areas 500 may be formed. The p+ areas 500 may be separated from the n type pillar areas 200 and disposed at a portion corresponding to the second portion B of the first surface of the n+ type silicon carbide substrate 100. That is, the p+ areas 500 may be positioned at a corresponding portion between the n type pillar areas 200.

As shown in FIG. 1, the schottky electrode 600 may be formed on the p+ areas 500 and the n− type epitaxial layer 400, and at the second surface of the n+ type silicon carbide substrate 100, the ohmic electrode 700 may be formed. The schottky electrode 600 contacts the p+ areas 500 and the n− type epitaxial layer 400.

Hereinafter, a characteristic of an SBD according to an exemplary embodiment of the present disclosure will be described in detail with reference to FIGS. 9 to 11.

Figure 9A:
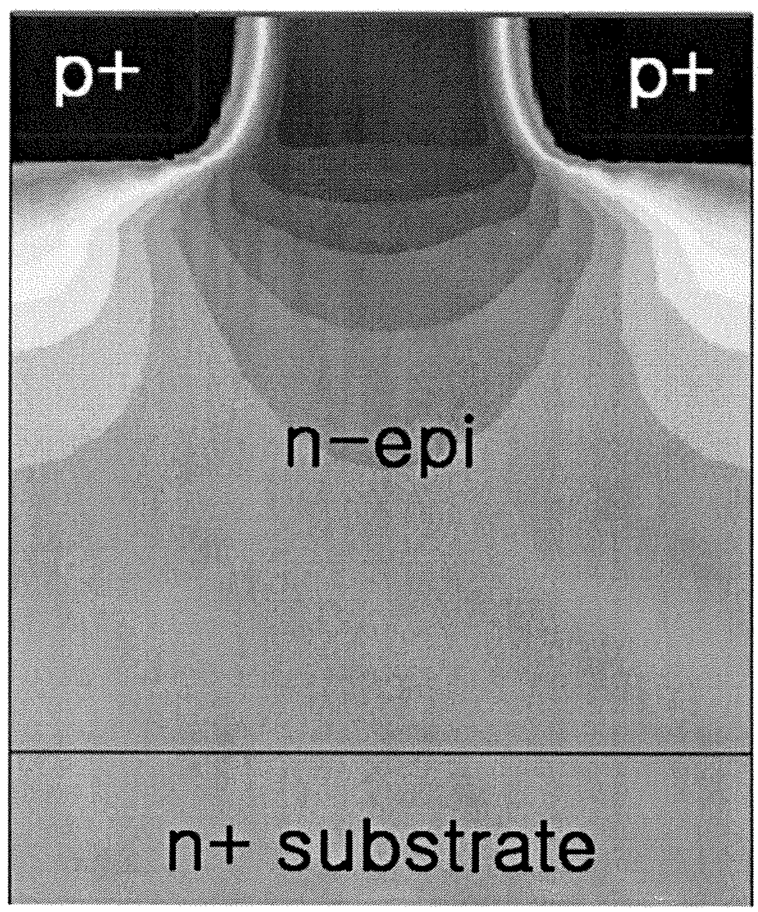
FIG. 9A is a diagram illustrating a flow of electrons and a current when a forward direction voltage of a conventional SBD is applied.
Figure 9B:
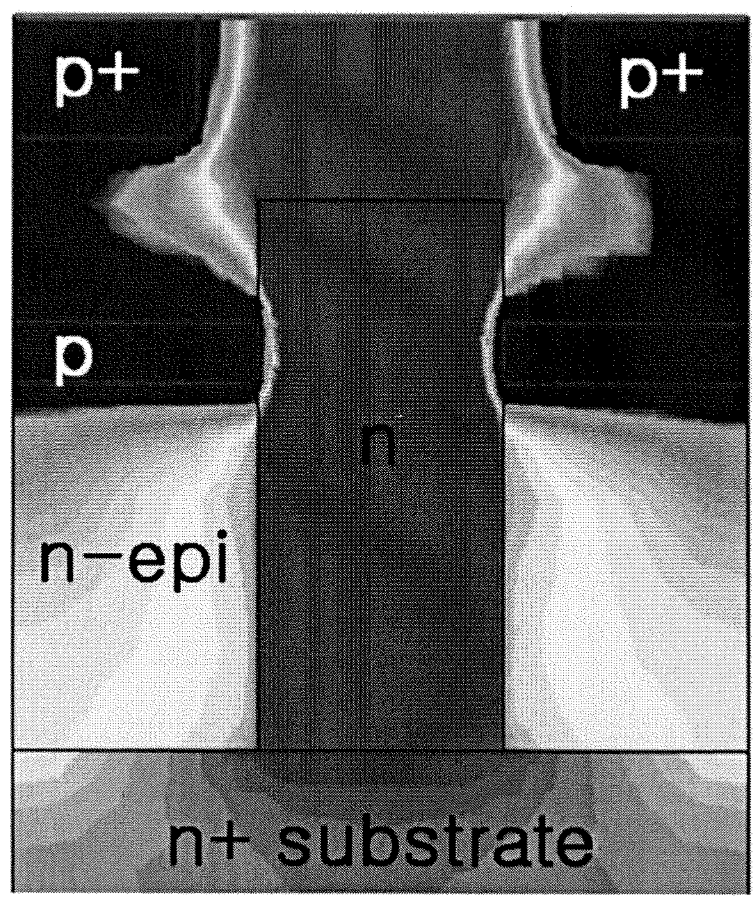
FIG. 9B is a diagram illustrating a flow of electrons and a current when a forward direction voltage of an SBD is applied according to an exemplary embodiment of the present disclosure.
Figure 10:
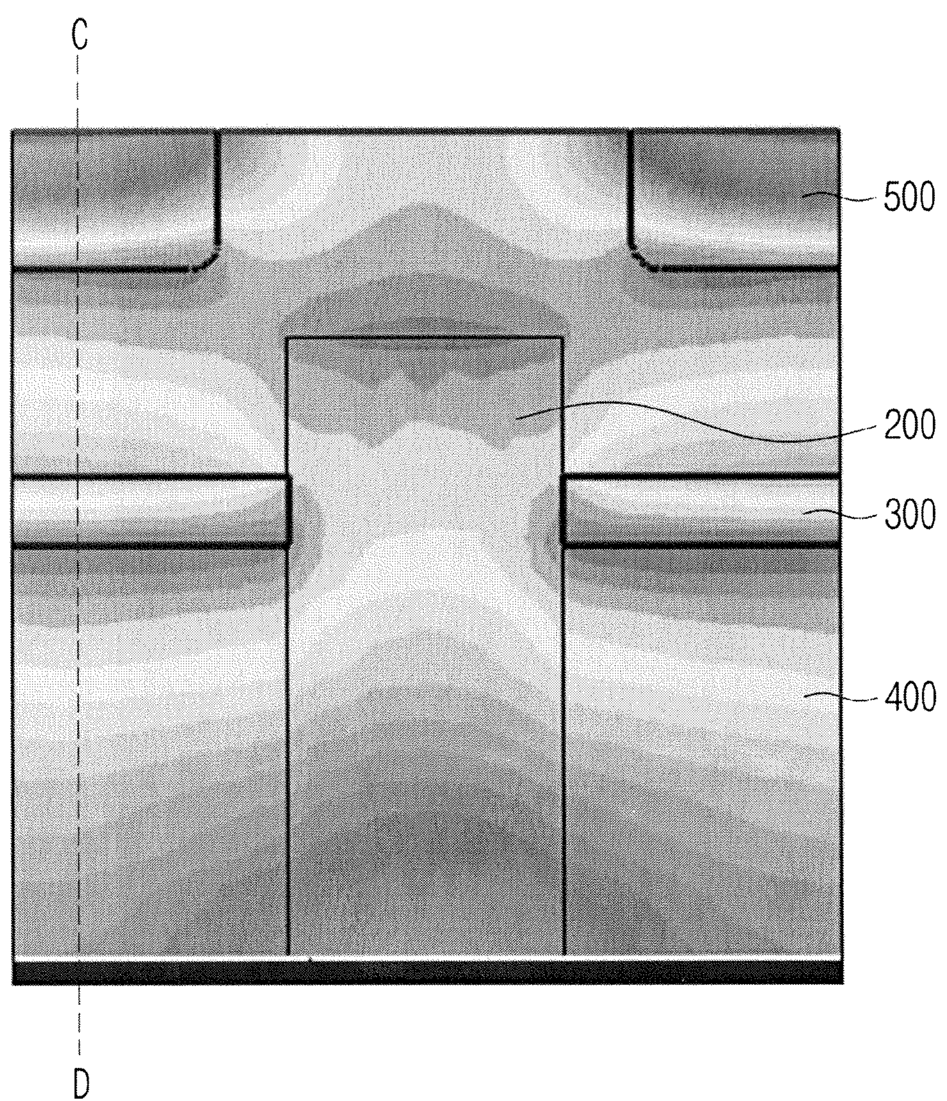
FIG. 10 is a diagram illustrating a simulation result of an electric field distribution when a backward direction voltage of an SBD is applied according to an exemplary embodiment of the present disclosure.

In FIGS. 9A, 9B, and 10, a lighter tinting represents a flow of electrons and a current, and a darker tinting represents that an amount of electrons and a current is much.

FIGS. 9A and 9B are diagrams illustrating a simulation result of a flow of electrons and a current when a forward direction voltage of an SBD is applied.

FIG. 9A is a diagram illustrating a flow of electrons and a current when a forward direction voltage of a conventional SBD is applied, and FIG. 9B is a diagram illustrating a flow of electrons and a current when a forward direction voltage of an SBD is applied according to an exemplary embodiment of the present disclosure.

As shown in FIG. 9A, when a forward direction voltage is applied, in a conventional SBD, an amount of electrons and a current is much at a schottky junction portion between the p+ areas, and as advancing toward an ohmic electrode, an amount of electrons and a current decreases.

As shown in FIG. 9B, in an SBD according to an exemplary embodiment of the present disclosure, when a forward direction voltage is applied, in a schottky junction portion between the p+ areas, a large amount of electrons and a current flows through an n type pillar area. That is, when a forward direction voltage of the SBD is applied, it can be seen that on-resistance of an SBD according to an exemplary embodiment of the present disclosure is largely reduced, compared with on-resistance of a conventional SBD.

Figure 11:
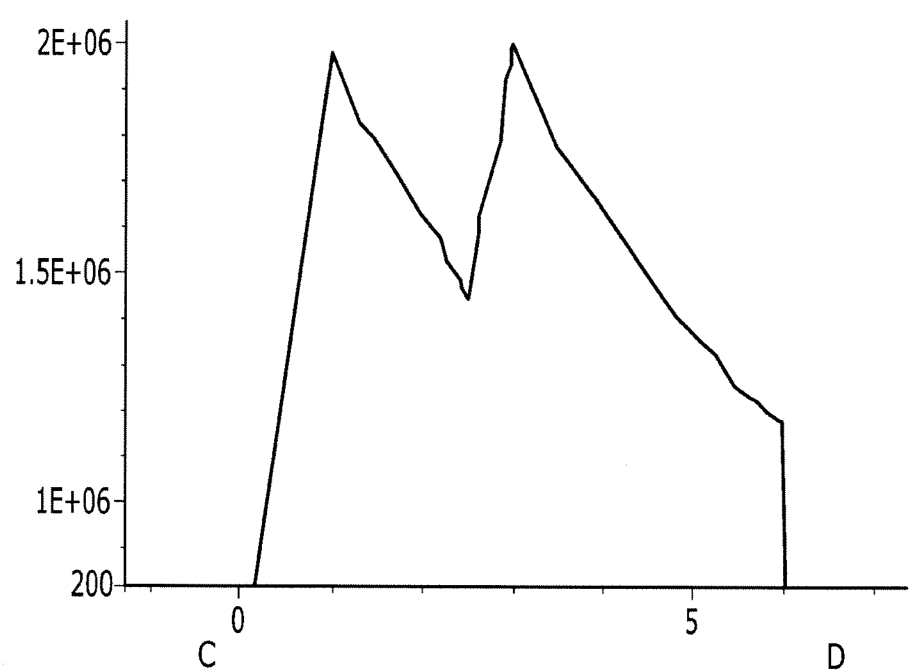
FIG. 11 is a graph illustrating an electric field distribution taken along line C-D of FIG. 10.

FIG. 10 is a diagram illustrating a simulation result of an electric field distribution when a backward direction voltage of an SBD is applied according to an exemplary embodiment of the present disclosure, and FIG. 11 is a graph illustrating an electric field distribution taken along line C-D of FIG. 10.

As shown in FIG. 10, in an SBD according to an exemplary embodiment of the present disclosure, when a backward direction voltage is applied, an amount of electrons and a current is much in a bonding portion of the n− type epitaxial layer 400 and a lower portion of the p+ areas 500, a bonding portion of the n− type epitaxial layer 400 and an upper portion of the n type pillar areas 200, and a bonding portion of the n− type epitaxial layer 400 and a lower portion of the p type area 300.

As shown in FIG. 11, an electric field distribution is highest in a bonding portion of the n− type epitaxial layer 400 and a lower portion of the p+ areas 500 and a bonding portion of the n− type epitaxial layer 400 and a lower portion of the p type area 300. An integral value of an electric field distribution graph of FIG. 11 represents a breakdown voltage, and due to existence of the p type area 300, an electric field distribution graph rises. Accordingly, an integral value of the electric field distribution graph increases. Therefore, in an SBD according to an exemplary embodiment of the present disclosure, when a backward direction voltage is applied, it can be seen that a breakdown voltage is not reduced.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A schottky barrier diode, comprising:

an n− type epitaxial layer that is disposed at a first surface of an n+ type silicon carbide substrate;

a plurality of n type pillar areas that are disposed at an inside of the n− type epitaxial layer and that are disposed at a first portion of the first surface of the n+ type silicon carbide substrate;

a p type area that is disposed at the inside of the n− type epitaxial layer and that is extended in a direction perpendicular to the n type pillar areas;

a plurality of p+ areas in which the n− type epitaxial layer is disposed at a surface thereof and that are separated from the n type pillar areas and the p type area;

a schottky electrode that is disposed on the n− type epitaxial layer and the p+ areas; and an ohmic electrode that is disposed at a second surface of the n+ type silicon carbide substrate, wherein the p type area is disposed between an upper surface of the n type pillar areas and the first surface of the n+ type silicon carbide substrate.

2. The schottky barrier diode of claim 1, wherein a doping concentration of the n type pillar areas is larger than that of the n− type epitaxial layer.

3. The schottky barrier diode of claim 2, wherein the p type area is disposed at a portion corresponding to a second portion of the first surface of the n+ type silicon carbide substrate adjacent to the first portion of the first surface of the n+ type silicon carbide substrate.

4. The schottky barrier diode of claim 3, wherein the p+ areas are disposed at a portion corresponding to the second portion of the first surface of the n+ type silicon carbide substrate.

5. The schottky barrier diode of claim 4, wherein the p type area and the p+ areas are disposed at a corresponding portion between the n type pillar area.

* * * * *